US010834842B1

(12) United States Patent
Elsasser et al.

(10) Patent No.: US 10,834,842 B1
(45) Date of Patent: Nov. 10, 2020

(54) RACK-MOUNTABLE ASSEMBLY WITH SPRING-HINGED MOUNTING BRACKET(S)

(71) Applicant: INTERNATIONAL BUSINESS MACHINES CORPORATION, Armonk, NY (US)

(72) Inventors: Ryan Elsasser, Poughkeepsie, NY (US); William Risk, San Jose, CA (US); Camillo Sassano, Durham, NC (US); Matthew Butterbaugh, Rochester, MN (US); Michael Good, Fountain, MN (US); Kevin L. Schultz, Raleigh, NC (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/448,125

(22) Filed: Jun. 21, 2019

(51) Int. Cl.
| | |
|---|---|
| H05K 1/14 | (2006.01) |
| H05K 7/14 | (2006.01) |
| H05K 7/18 | (2006.01) |
| H05K 7/16 | (2006.01) |

(52) U.S. Cl.
CPC ............. H05K 7/1489 (2013.01); H05K 7/16 (2013.01); H05K 7/183 (2013.01)

(58) Field of Classification Search
None
See application file for complete search history.

(56) References Cited

U.S. PATENT DOCUMENTS

| | | | |
|---|---|---|---|
| 3,711,053 | A | 1/1973 | Drake |
| 4,999,459 | A | 3/1991 | Smith et al. |
| 6,023,415 | A | 2/2000 | Mayer et al. |
| 6,080,930 | A | 6/2000 | Lommen et al. |
| 6,285,548 | B1 | 9/2001 | Hamlet et al. |
| 6,442,030 | B1 | 8/2002 | Mammoser et al. |
| 6,560,114 | B2 | 5/2003 | Berry et al. |
| 6,566,973 | B2 | 5/2003 | Schumacher |
| 6,590,784 | B2 | 7/2003 | Wortman et al. |
| 6,744,641 | B2 | 6/2004 | Schnabel |
| 6,839,237 | B2 | 1/2005 | Berry et al. |
| 7,013,558 | B2 | 3/2006 | Bachman |
| 7,214,888 | B1 | 5/2007 | Feroli et al. |

(Continued)

OTHER PUBLICATIONS

Crippen et al., "EMC Design of an Electronic Processing System Mounted in a Standard EIA Rack", IBM Publication, IP.com No. IPCOM000036377D, Published Jan. 29, 2005 (3 pages).

(Continued)

*Primary Examiner* — Xanthia C Cunningham
(74) *Attorney, Agent, or Firm* — Tihon Poltavets, Esq.; Kevin P. Radigan, Esq.; Heslin Rothenberg Farley & Mesiti P.C.

(57) ABSTRACT

Rack-mountable assemblies are provided which include a structure to be mounted to a frame of an electronics rack, and a spring-hinged mounting bracket associated with and extending from a side of the structure to facilitate mounting the structure to the frame of the electronics rack. The spring-hinged mounting bracket facilitates insertion of the structure into the frame by pivoting inward towards the side of the structure upon the spring-hinged mounting bracket encountering an obstruction as the rack-mountable assembly is positioned within the frame for mounting to the frame.

20 Claims, 13 Drawing Sheets

(56) References Cited

U.S. PATENT DOCUMENTS

| | | | |
|---|---|---|---|
| 7,262,972 | B1 | 8/2007 | Gundogan et al. |
| 7,298,624 | B2 | 11/2007 | Boswell et al. |
| 7,388,754 | B2 | 6/2008 | Chen |
| 7,656,681 | B2 | 2/2010 | Tracewell |
| 7,705,248 | B2 | 4/2010 | Lowffelholz et al. |
| 7,857,267 | B2 | 12/2010 | Watts |
| 7,969,748 | B2 | 6/2011 | Niederkorn et al. |
| 7,990,726 | B2 | 8/2011 | Izuhara et al. |
| 8,351,196 | B2 * | 1/2013 | Sun .................... G06F 1/187 |
| | | | 361/679.33 |
| 9,095,045 | B2 | 7/2015 | Rojo et al. |
| 9,124,956 | B2 | 9/2015 | Heimann et al. |
| 9,313,935 | B2 | 4/2016 | Soo Hoo et al. |
| 9,462,732 | B2 | 10/2016 | Robinson et al. |
| 9,609,778 | B1 * | 3/2017 | Spencer ............... H05K 7/1489 |
| 9,795,052 | B2 * | 10/2017 | Hsiao .................... H05K 5/023 |
| 10,058,005 | B1 | 8/2018 | Willard |
| 2007/0115627 | A1 * | 5/2007 | Carlisi .................. G06F 1/183 |
| | | | 361/679.01 |
| 2008/0037203 | A1 | 2/2008 | Wayman |
| 2008/0080158 | A1 | 4/2008 | Crocker et al. |
| 2008/0135705 | A1 | 6/2008 | Chuang |
| 2009/0129009 | A1 * | 5/2009 | Zhang ................. G11B 33/121 |
| | | | 361/679.34 |
| 2009/0224115 | A1 * | 9/2009 | Zhang .................... G06F 1/187 |
| | | | 248/201 |
| 2012/0229987 | A1 | 9/2012 | Peng et al. |
| 2013/0115869 | A1 | 5/2013 | Alshinnawi et al. |
| 2014/0021154 | A1 | 1/2014 | Chen |
| 2014/0042883 | A1 | 2/2014 | Lin |
| 2015/0156912 | A1 * | 6/2015 | Liang ....................... E05C 1/08 |
| | | | 361/726 |
| 2016/0150659 | A1 * | 5/2016 | Chen ..................... E05C 1/145 |
| | | | 312/223.2 |
| 2018/0228049 | A1 * | 8/2018 | Liao ..................... A47B 88/477 |

OTHER PUBLICATIONS

Anonymous, "Enhanced Frame Assembly with Separable Central Electronic Complex Cage Structure", IBM Publication, IP.com No. IPCOM000229483D, Published Jul. 31, 2013 (9 pages).

Grace Period Disclosure: O'Brien, Jeremy W., "AFRL, IBM Unveil World's Largest Neuromorphic Digital Synaptic Super Computer", Air Force Research Laboratory Information Directorate, published Jul. 24, 2018, at: https://www.wpafb.af.mil/News/Article-Display/Article/1582310/afrl-ibm-unveil-worlds-largest-neuromorphic-digital-synaptic-super-computer/ (1 page).

DL Custom, "Wall Mount Brackets", Online Product Brochure, https://www.dlcustom.com/wp-content/uploads/2018/05/42.pdf, downloaded on Mar. 18, 2019 (1 page).

* cited by examiner

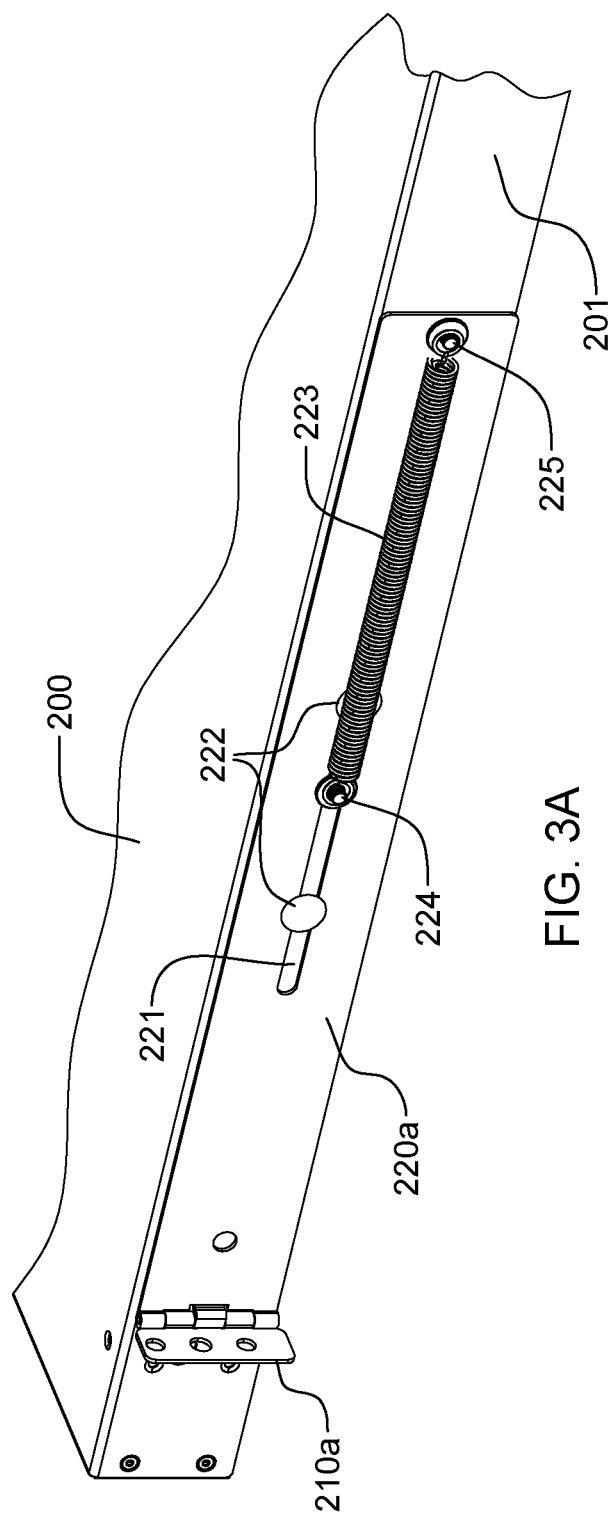

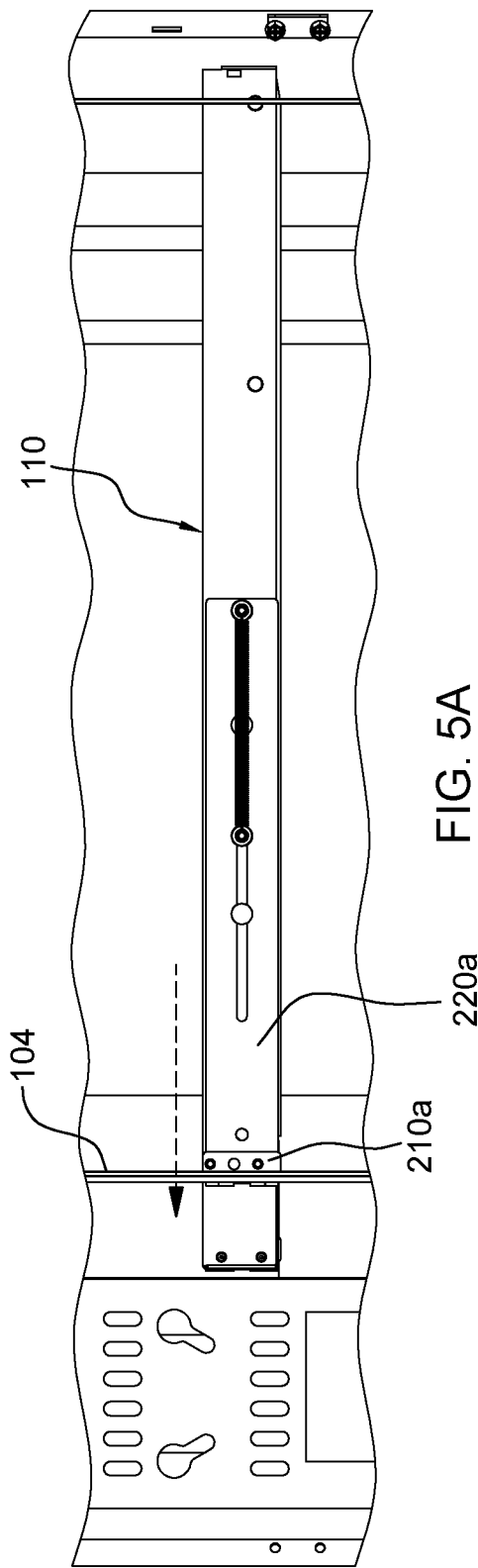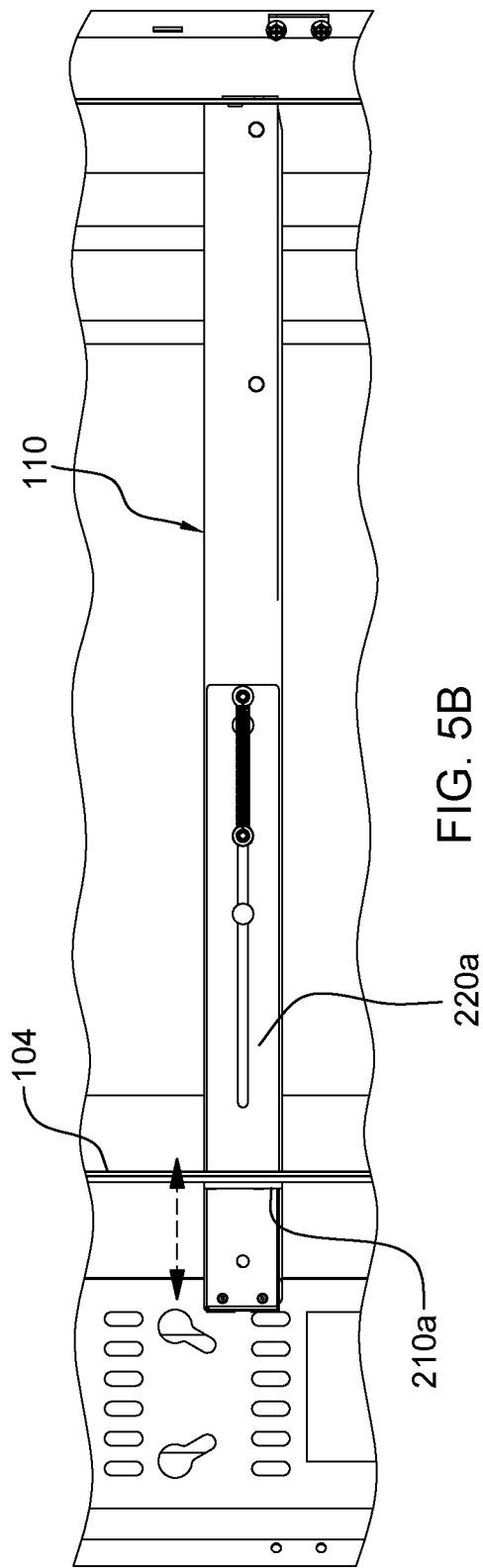

RACK-MOUNTABLE ASSEMBLY WITH SPRING-HINGED MOUNTING BRACKET(S)

STATEMENT REGARDING FEDERALLY SPONSORED RESEARCH OR DEVELOPMENT

This invention was made with Government support under Contract Number FA8750-17-C-0097, awarded by the United States Air Force (USAF). The Government has certain rights to this invention.

STATEMENT REGARDING PRIOR DISCLOSURES

The following disclosure is submitted under 35 U.S.C. § 102(b)(1)(A):

DISCLOSURE(S): "AFRL, IBM Unveil World's Largest Neuromorphic Digital Synaptic Super Computer", by Jeremy W. O'Brien, Air Force Research Laboratory Information Directorate, published Jul. 24, 2018, at: https://www-.wpafb.af.mil/News/Article-Display/Article/1582310/afrl-ibm-unveil-worlds-largest-neuromorphic-digital-synaptic-super-computer/(1 page).

BACKGROUND

In many computer applications, including information technology (IT) applications, processors, along with their associated electronics (e.g., memory, disk drives, power supplies, etc.), are packaged in electronic component chassis or drawer configurations stacked within an electronics rack or frame. An electronic component chassis, such as a server chassis, can be removable from the computer rack, or in a fixed location within the rack.

As circuit density of electronic devices continues to increase in order to achieve faster and faster processing speeds, there is corresponding demand for circuit devices to be packed more closely together. Each new generation of processors and associated electronics continues to offer increased speed and function. In many cases, this is accomplished, in part, by increased packaging density. The net result has been increased circuit density at all levels of packaging, including at the chassis or drawer level. This increased packaging density continues to require enhancements to chassis-level designs, and associated structures.

SUMMARY

Certain shortcomings of the prior art are overcome and additional advantages are provided through the provision, in one or more aspects, of an apparatus which includes a rack-mountable assembly for an electronics rack. The rack-mountable assembly includes a structure to be mounted to a frame of the electronics rack, and a spring-hinged mounting bracket associated with and extending from a side of the structure to facilitate mounting the structure to the frame. The spring-hinged mounting bracket facilitates insertion of the structure into the frame by pivoting inward towards the side of the structure upon the spring-hinged mounting bracket encountering an obstruction as the rack-mountable assembly is positioned within the frame for mounting to the frame.

In another aspect, an apparatus is provided which includes an electronics rack including a frame, and a rack-mountable assembly. The rack-mountable assembly includes a structure configured for the electronics rack, and a spring-hinged mounting bracket associated with and extending from a side of the structure to facilitate mounting the structure to the frame of the electronics rack. The spring-hinged mounting bracket facilitates insertion of the structure into the frame by pivoting inward towards the side of the structure upon the spring-hinged mounting bracket encountering an obstruction as the rack-mountable assembly is positioned within the frame for mounting to the frame.

In a further aspect, a method is provided which includes providing a rack-mountable assembly for an electronics rack. Providing the rack-mountable assembly includes providing a structure to be mounted a frame of the electronics rack, and associating a spring-hinged mounting bracket with a side of the structure to extend from the side of the structure and facilitate mounting the structure to the frame. The spring-hinged mounting bracket facilitates insertion of the structure into the frame by pivoting inward towards the side of the structure upon the spring-hinged mounting bracket encountering an obstruction as the rack-mountable assembly is positioned within the frame for mounting to the frame.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 3A depicts an enlarged view of a slidable member and spring-hinged mounting bracket of the rack-mountable assembly embodiment of FIGS. 2A-2C, in accordance with one or more aspects of the present invention;

FIGS. 5A & 5B are elevational views of the rack-mountable assembly of FIGS. 2A-4D being positioned within a frame of an electronics rack with the sliding member shown adjustable based on the location of the back vertical rail flange, to which the spring-hinged mounting bracket is to be affixed, in accordance with one or more aspects of the present invention;

DETAILED DESCRIPTION

Aspects of the present invention and certain features, advantages and details thereof, are explained more fully below with reference to the non-limiting example(s) illustrated in the accompanying drawings. Descriptions of well-known systems, devices, fabrication techniques, etc., are omitted so as not to unnecessarily obscure the invention in detail. It should be understood, however, that the detailed description and the specific example(s), while indicating aspects of the invention, are given by way of illustration only, and not by way of limitation. Various substitutions, modifications, additions, and/or other arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application of an apparatus, or rack-mountable assembly, with spring-hinged mounting brackets, such as disclosed herein.

As noted, as circuit density of electronic devices continues to increase in order to achieve faster and faster processing speeds, there is a corresponding demand for devices to be packed more closely together, including within an electronics or computer rack, as well as within an electronic component chassis coupled to the rack. In one or more implementations, an electronic component chassis, such as a drawer, is a frame or other internal support structure on or within which one or more circuit board assemblies and/or other electronic devices or components are mounted. As one example, an electronic component chassis can be a server chassis, which can be removable from an electronics rack, or mounted in a fixed location within the rack. Traditionally, an electronics rack is a metal frame structure used to hold various hardware devices, such as servers, hard disk drives, modems, and other electronic equipment. While racks are provided in many different shapes and sizes, a standard-sized rack established by the Electronics Industries Association (EIA) for use with computers and other electronic equipment is typically 19-inches or 23-inches wide.

Figure 1:
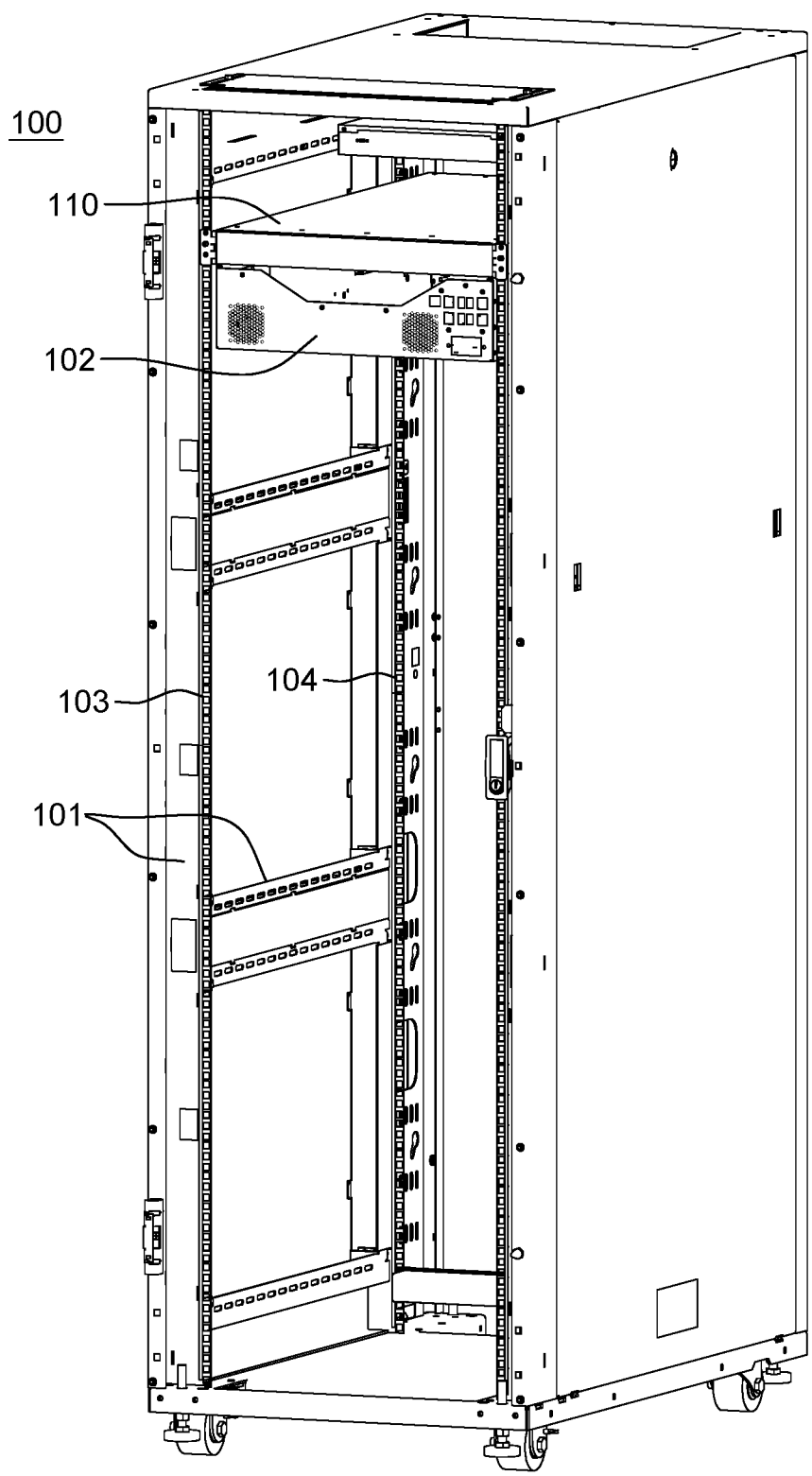
FIG. 1 depicts one embodiment of an electronics rack or frame to accommodate one or more rack-mountable assemblies, in accordance with one or more aspects of the present invention.

By way of example, FIG. 1 depicts one embodiment of an EIA standard-width electronics rack 100, having multiple vertical and horizontal support rails 101. For instance, electronics rack 100 includes, in one or more embodiments, front vertical mounting rails 103 and rear vertical mounting rails 104, which include respective flanges for mounting one or more electronic component chassis 102 to the frame of electronics rack 100. At least one electronic component chassis 102 can be, or have associated therewith, a rack-mountable assembly 110, such as a cover structure. In one or more embodiments, electronic component chassis 102 and the associated cover structure are configured to form an enclosure about one or more circuit board assemblies and/or other electronic components disposed within electronic component chassis 102. Note that for purposes of illustration only, electronics rack 100 is substantially unpopulated in FIG. 1, with the exception of electronic component chassis 102 and rack-mountable assembly 110.

Traditionally, a computer server drawer features a top cover that is rigidly latched to the drawer chassis, and the combination must be slid out of the server rack on slides before the top cover can be unlatched and removed from the server drawer. In certain data center applications, such a loose top cover can be a liability, or otherwise undesirable during service and/or maintenance of an electronics rack.

Addressing this concern, disclosed herein an electronic component chassis, or server drawer, which slides relative to a separate, rack-mounted, fixed cover structure. In this context, since a cover structure for, for instance, a 19-inch electronic component chassis is of a known, fixed width, and must interface with, for instance, traditional rigid, vertical mounting rail flanges within the rack, size restrictions and available space within the rack would prevent the cover structure from being moved directly into place into the server rack using only fixed-angle mounting brackets attached to the cover structure. This could especially be an issue during service and maintenance, where a populated rack could prevent the cover structure from being tilted for insertion into position within the rack or removal from the rack.

As a further issue, traditional, single-size rails for electronic component chassis, such as server drawers, and their associated covers, only fit customer racks that fall within a narrow window of depths, and are not sufficiently adaptable to customer racks of varying depths. Note in this regard that the depth at issue within the electronics rack refers to the location of the rear vertical mounting rails 104, and in particular, the mounting flanges associated therewith, relative to the front vertical mounting rails 103, where the structure is to mount within the electronics rack to the front and rear vertical mounting rails. For instance, the depth of the rear vertical mounting rail can be determined, for instance, from the front vertical mounting rail of the electronics rack, with the location of the rear vertical mounting rails varying, for instance, between different rack designs, and even between different standard 19-inch wide electronics rack designs.

Advantageously, disclosed herein is, in one or more embodiments, a single-piece, rack-mountable assembly with adjustability features including, for instance, spring-hinged mounting brackets, and slidable members, such as spring-biased, telescoping side mounting surfaces. In one or more implementations, the rack-mountable assembly includes a structure, such as a cover structure or component support structure. Since traditionally-sized computer racks are of standard width, the unique adjustability features allow the single-piece assembly to fit and fixedly mount within the frame, event where the depth of the rear mounting support rails varies, either within the same or between different racks.

Generally stated, disclosed herein is an apparatus, or rack-mountable assembly, which includes a structure to be mounted to a frame of the electronics rack, and a spring-hinged mounting bracket associated with and extending from a side of the structure to facilitate mounting the structure to the frame. The spring-hinged mounting bracket facilitates insertion of the structure into the frame by pivoting inward towards the side of the structure upon the spring-hinged mounting bracket encountering an obstruction as the rack-mountable assembly is positioned within the frame for mounting to the frame.

In one or more embodiments, the rack-mountable assembly includes multiple spring-hinged mounting brackets to facilitate mounting the structure to the frame, with the spring-hinged mounting bracket being one spring-hinged mounting bracket of the multiple spring-hinged mounting brackets. In one embodiment, the structure includes opposite first and second sides, and a first spring-hinged mounting bracket of the multiple spring-hinged mounting brackets is mounted to and extends from the first side of the structure, and a second spring-hinged mounting bracket of the multiple spring-hinged mounting brackets is mounted to and extends from the second side of the structure.

In one or more embodiments, the first side of the structure includes a first slidable member, with a leaf of the first spring-hinged mounting bracket being the first slidable member (or being coupled thereto), and the second side of the structure includes a second slidable member, with a leaf of the second spring-hinged mounting bracket being the second slidable member (or being coupled thereto). In one implementation, the first and second slidable members are first and second spring-biased, telescoping side mounting surfaces that facilitate the first and second spring-hinged mounting brackets contacting respective vertical mounting rails of the frame of the electronics rack for mounting thereto.

Further, in one or more embodiments, the first and second spring-hinged mounting brackets are closer to one end of the structure than another end of the structure, and the structure includes first and second fixed-angle mounting brackets affixed to and extending from the structure closer to the other end of the structure, with the one end and the other end being opposite ends of the structure.

In one embodiment, the structure, the multiple spring-hinged mounting brackets, and the first and second slidable members are integrated as a single-piece assembly for mounting to any of multiple electronics racks, where the multiple electronics racks have vertical mounting rail flanges to which the multiple spring-hinged mounting brackets are to be mounted, and where the vertical mounting rail flanges are located at different depths within different electronics racks of the multiple electronics racks.

In one or more implementations, the structure mounts horizontally within the frame of the electronics rack, with the frame including multiple vertical mounting rails, and the obstruction being a vertical mounting rail of the multiple vertical mounting rails of the frame.

Further, in one embodiment, the structure is a cover structure or a component support structure. For instance, the apparatus can include an electronic component drawer coupled to the frame of the electronics rack, and the structure of the rack-mountable assembly is a cover structure which includes a cover for the electronic component drawer, where the cover is to fixedly mount to the frame of the electronics rack.

In one or more other embodiments, the structure is a component support structure which includes a tray to fixedly mount to the frame of the electronics rack. Further, in one or more embodiments, the structure is a component support structure which includes an electronic component chassis to fixedly mount to the frame of the electronics rack.

By way of illustration, FIGS. 2A-5B depict one embodiment of an apparatus or rack-mountable assembly for mounting to the frame of an electronics rack, such as electronics rack 100 of FIG. 1. As noted above, numerous variations on the embodiment depicted will be apparent to those skilled in the art based on the description provided herein.

Figure 2A:
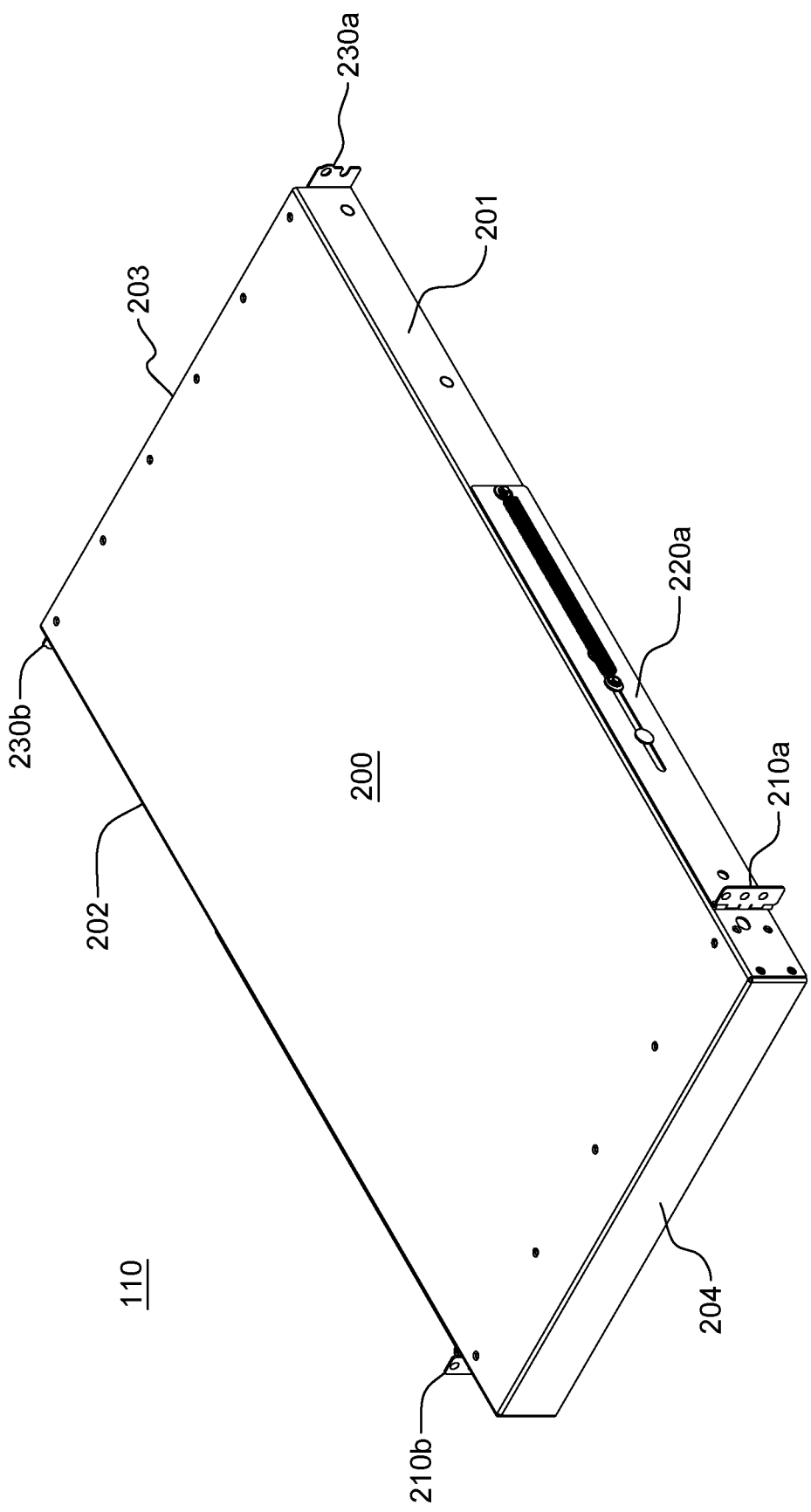
FIG. 2A depicts one embodiment of a rack-mountable assembly to be fixedly mounted to a frame of an electronics rack, in accordance with one or more aspects of the present invention.
Figure 2B:
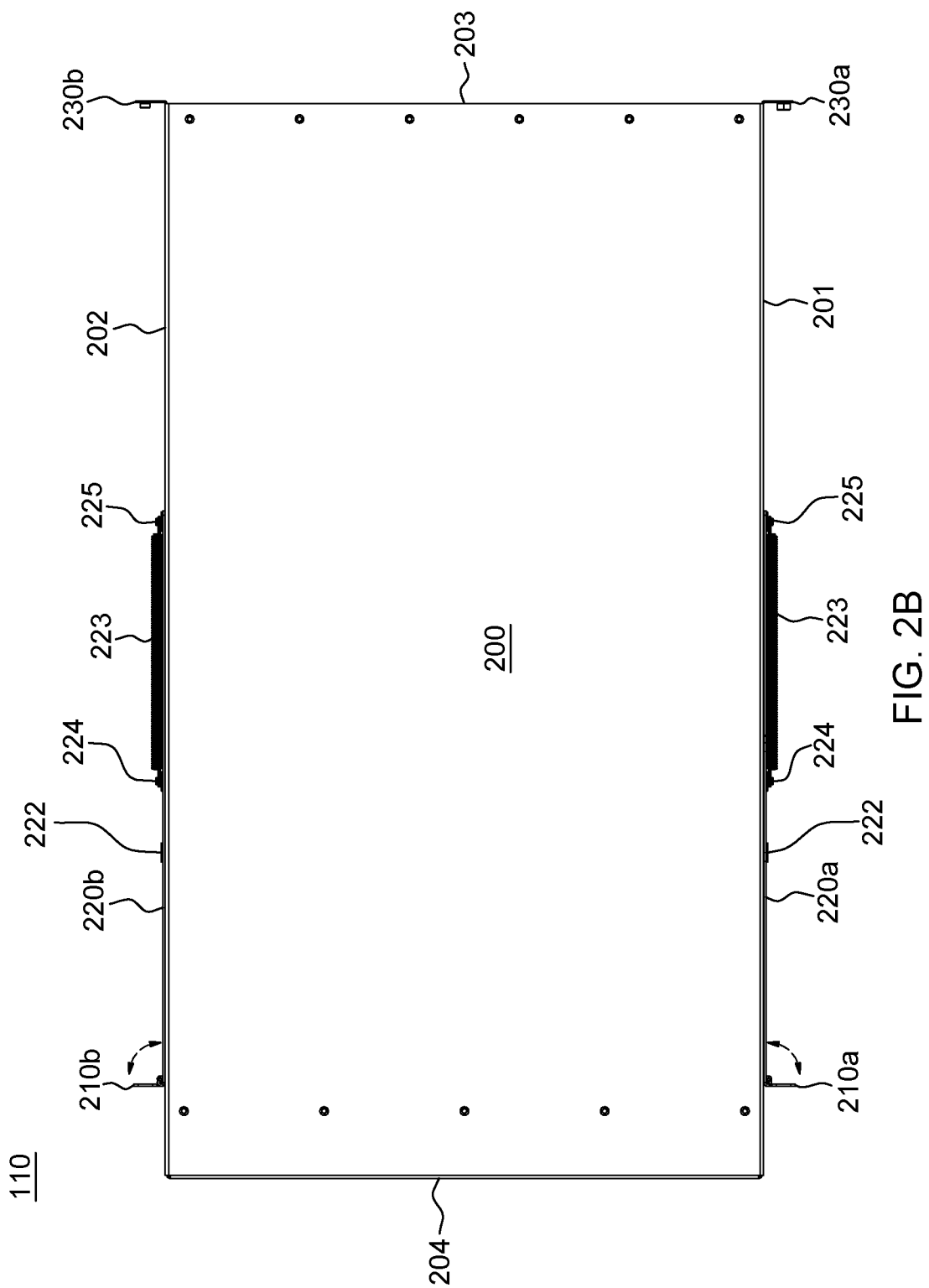
FIG. 2B is a top plan view of the rack-mountable assembly embodiment of FIG. 2A, in accordance with one or more aspects of the present invention.
Figure 2C:
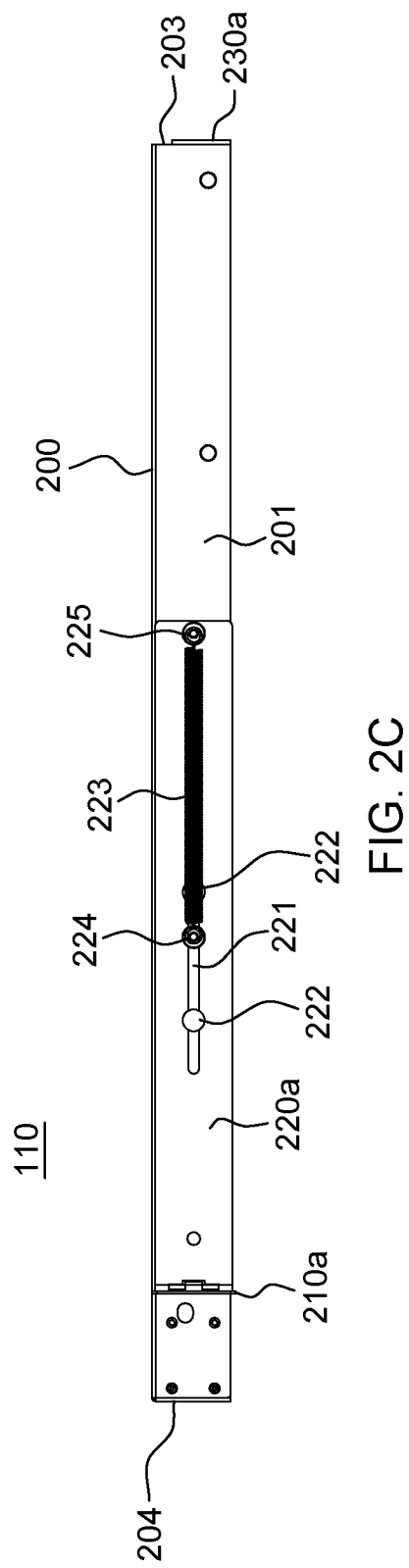
FIG. 2C is a side elevational view of the rack-mountable assembly embodiment of FIGS. 2A & 2B, in accordance with one or more aspects of the present invention.

Referring initially to FIGS. 2A-2C, one embodiment of a rack-mountable assembly 110 configured as a cover structure to be fixedly mounted to the frame of an electronics rack is illustrated. Rack-mountable assembly 110 includes a structure 200, such as a cover structure, with opposite first and second sides 201, 202, and with one end 203 and another end 204, which are opposite ends of structure 200. In the embodiment illustrated, structure 200 is a rectangular-shaped lid structure configured to at least partially enclose one or more electronic components or devices within an electronic component chassis, such as electronic component chassis 102 of FIG. 1. As noted, rack-mountable assembly 110 is, in one embodiment, a single-piece assembly, with the parts illustrated being permanently coupled together within the assembly. Note that the size, shape and configuration of first and second sides 201, 202, as well as of ends 203, 204, can vary depending, for instance, on the particular configuration of the electronic component chassis with which the cover structure is to mate when both are positioned within the electronics rack.

As illustrated in FIGS. 2A-2C, in one embodiment, rack-mountable assembly 110 includes a first spring-hinged mounting bracket 210a associated with and extending from first side 201 of structure 200, and a second spring-hinged mounting bracket 210b associated with and extending from second side 202 of structure 200. In the embodiment illustrated, first side 201 of structure 200 includes a first slidable member 220a, and the first spring-hinged mounting bracket 210a is part of or otherwise associated with first slidable member 220a. Similarly, second side 202 of structure 200 includes a second slidable member 220b, and second spring-hinged mounting bracket 210b is part of or otherwise associated with second slidable member 210b.

In the embodiment illustrated, first and second slidable members 220a, 220b are first and second spring-biased, telescoping side mounting surfaces which include respective elongated slots 221 through which guide pins 222 extend and slidably couple the slidable member to the respective side of structure 200. Further, in the embodiment illustrated, the slidable members are spring-biased via a respective linear spring 223 that is positioned between a first support pin 224 affixed to the side of structure 200, and extending through slot 221, and a second support pin 225 coupled to the slidable member only. In this manner, spring-biasing is provided within a distance defined between guide pins 222. For instance, in one or more embodiments, guide pins 222 could be in the range of 2-6 inches apart, such that the spring-biased, telescoping side mounting surfaces can respectively telescope or retract, as required, for a particular frame configuration in order to align the corresponding first and second spring-hinged mounting brackets 210a, 210b, with (for instance) the respective rear vertical mounting rails of the rack. Note that this example assumes that the rack-mountable assembly is moved into position within the frame for mounting to the frame from a front of the electronics rack. In the case where the rack-mountable assembly is moved into position within the frame from the rear of the electronics rack, then the first and second spring-hinged mounting brackets 210a, 210b would mount to the front vertical mounting rails of the rack.

As noted, in one or more embodiments, rack-mountable assembly 110 is a single-piece assembly. This can be accomplished, in part, by providing guide pins 222 and first and second support pins 224, 225 as swaged couplings, such as rivet-type couplings, permanently, slidably affixing slidable members 220a, 220b, to the respective sides of structure 200. Note in particular that guide pins 220 and first support pin 224, are of sufficient size to allow the slidable members 220a, 220b, to slide relative to the respective side of cover structure 200 within the respective elongated slot 221.

Figure 3B:
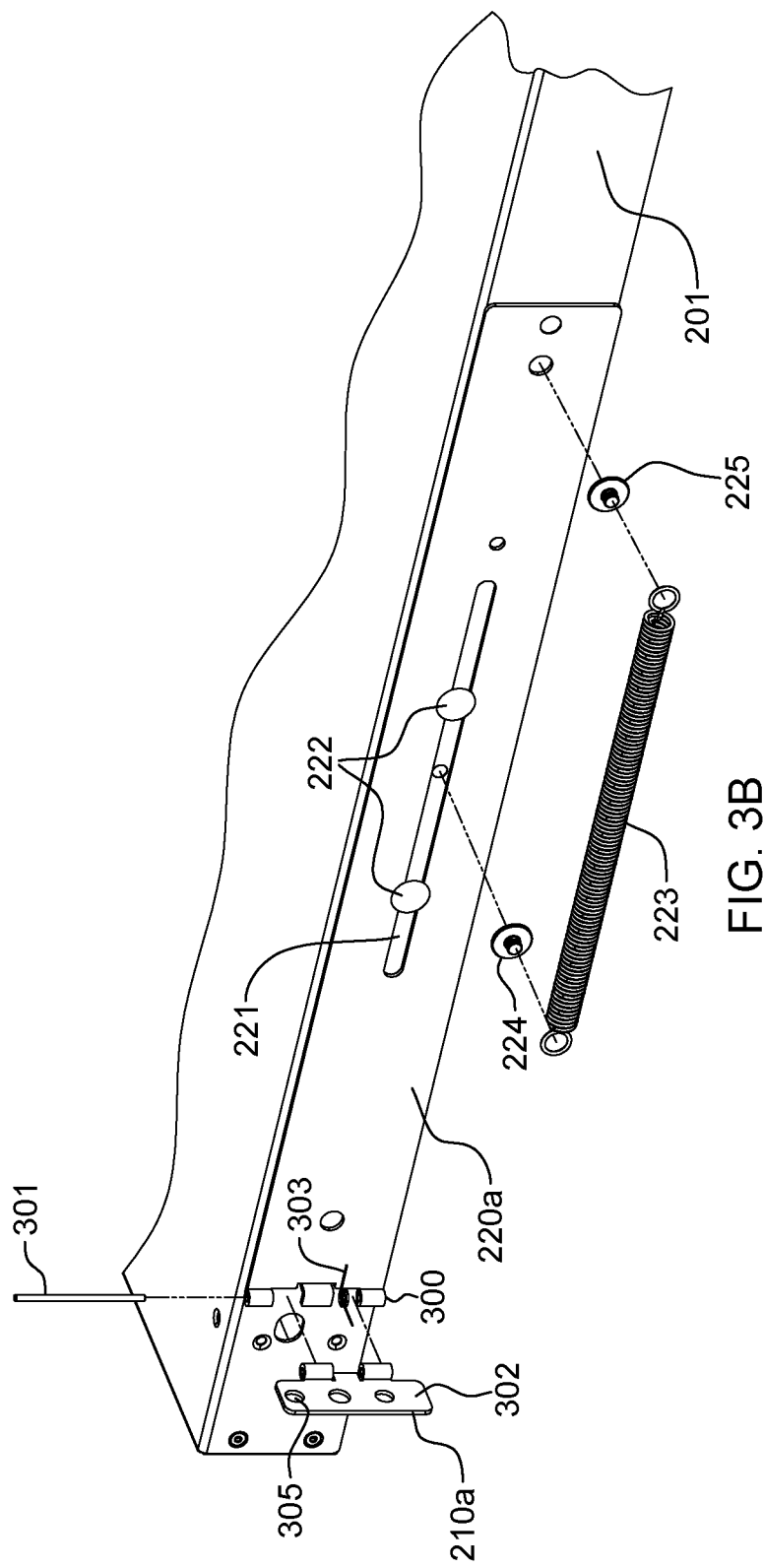
FIG. 3B is an exploded view of the slidable member and spring-hinged mounting bracket of FIG. 3A, in accordance with one or more aspects of the present invention.

FIGS. 3A & 3B depict in greater detail one embodiment of slidable member 220a and spring-hinged mounting bracket 210a associated therewith. In one or more implementations, slidable member 220b and spring-hinged mounting bracket 210b associated therewith are identical to slidable member 220a and spring-hinged mounting bracket 210a. As noted, the spring-hinged mounting brackets are provided for ease of installation of the rack-mountable assembly within a frame of an electronics rack. The spring-biasing of the spring-biased mounting brackets allow the rack-mountable assembly to be slid into final position within the frame, even when the frame is fully populated, as designed. Further, the spring-hinged mounting brackets allow the rack-mountable assembly to be slid into position within the frame of the electronics rack from either the front or back of the rack, such as might be desirable during servicing or maintenance of the electronics rack.

As illustrated in FIG. 3B, slidable member 220a is (in one embodiment) a leaf of spring-hinged mounting bracket 210a and is formed with a non-pivoting portion 300 of spring-hinged mounting bracket 210a as a part of slidable member 220a at one end thereof. The other leaf 302 of spring-hinged mounting bracket 210a aligns with non-pivoting portion 300, and a hinge pin 301 couples the leaves of spring-hinged mounting bracket 210a together. Further, a hinge spring 303 is provided within spring-hinged mounting bracket 210a to spring-bias the mounting bracket open outward from slidable member 220a at an angle. For instance, in one embodiment, leaf 302 of spring-hinged mounting bracket 210a is biased at a right angle to slidable member 220a. The ends of hinge pin 301 can be swaged in implementation in order to secure the spring-hinged mounting bracket 210a to the slidable member 220a as a single-piece assembly. In the embodiment illustrated, openings 305 are provided in leaf 302, which are sized and positioned to align with corresponding openings in a vertical mounting rail flange within the electronics rack to which the rack-mountable assembly is to be fixedly secured using, for instance, appropriately sized and configured fasteners.

As noted, slidable member 220a is (in one embodiment) a spring-biased, telescoping side mounting surface, which includes elongated slot 221 accommodating guide pins 222, as well as first support pin 224 affixed to the side of the structure. Spring 223 biases, in one embodiment, the spring-biased, telescoping side surface in an extended position to facilitate contacting of spring-hinged mounting bracket 210a with the respective vertical mounting rail within the rack as the rack-mountable assembly is moved into position within the frame for mounting to the frame. Spring 223 couples to first and second support pins 224, 225 at its ends with, for instance, the support pins being deformed or swaged once the spring is in position, to securely capture the ends of the spring, thus facilitating defining the single-piece assembly. Note that as used herein, the phrase single-piece assembly refers to there being no parts to assemble in association with positioning the assembly within the electronics rack, that is, other than the fasteners (not shown) used to rigidly mount the assembly to the frame of the electronics rack, as described herein.

Figure 4A:
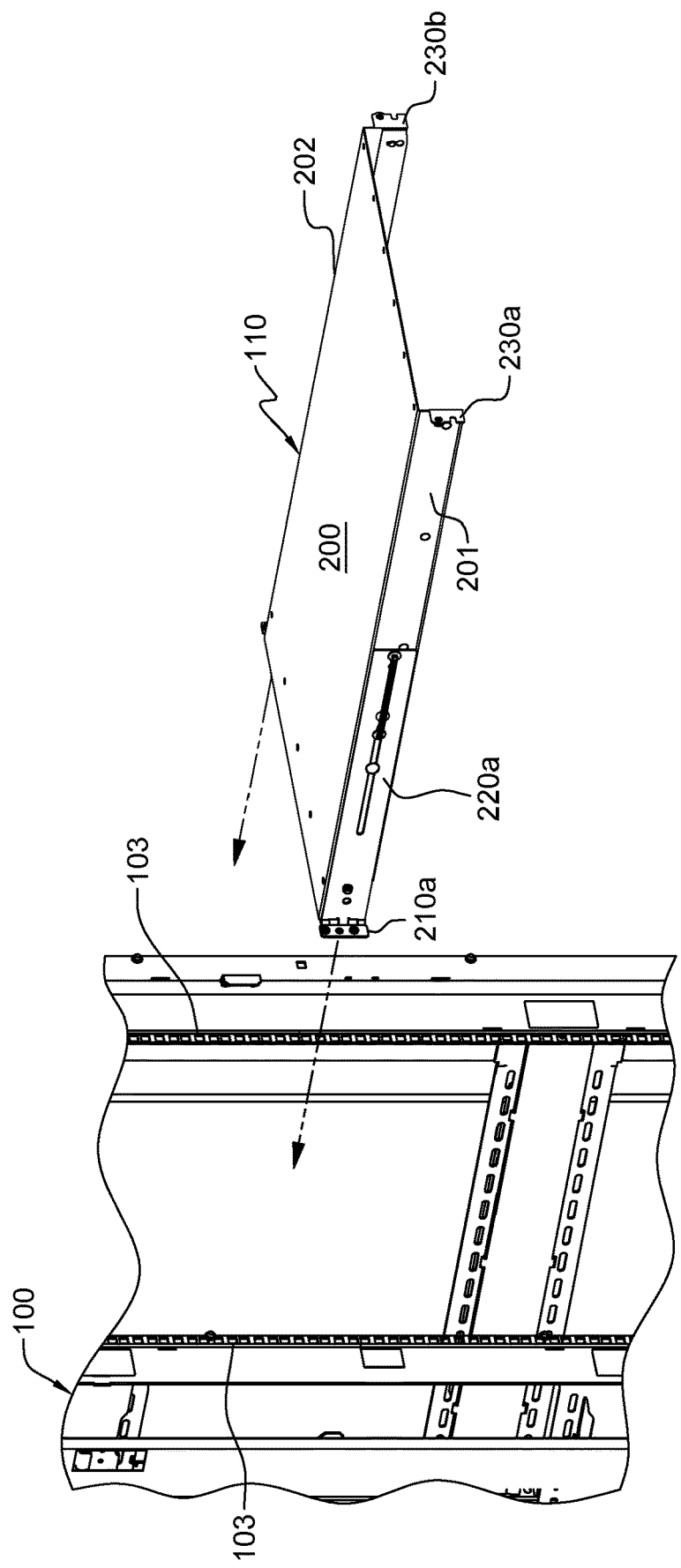
FIGS. 4A-4D depict insertion of the rack-mountable assembly of FIGS. 2A-3B into an electronics rack for mounting to the frame of the electronics rack, including showing pivoting of the spring-hinged mounting bracket(s) inward towards the side(s) of the structure upon encountering an obstruction, in accordance with one or more aspects of the present invention.
Figure 4B:
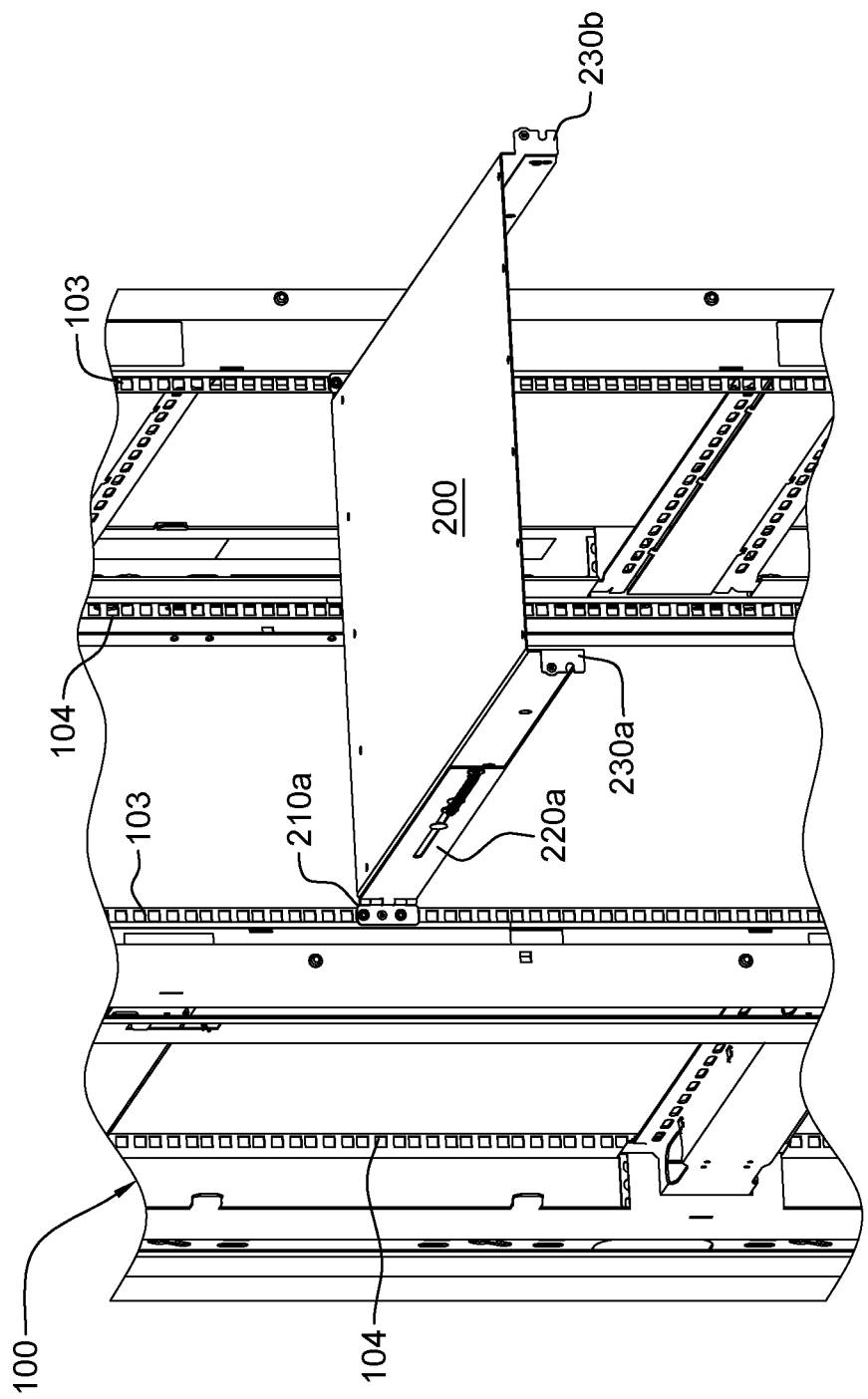
Figure 4C:
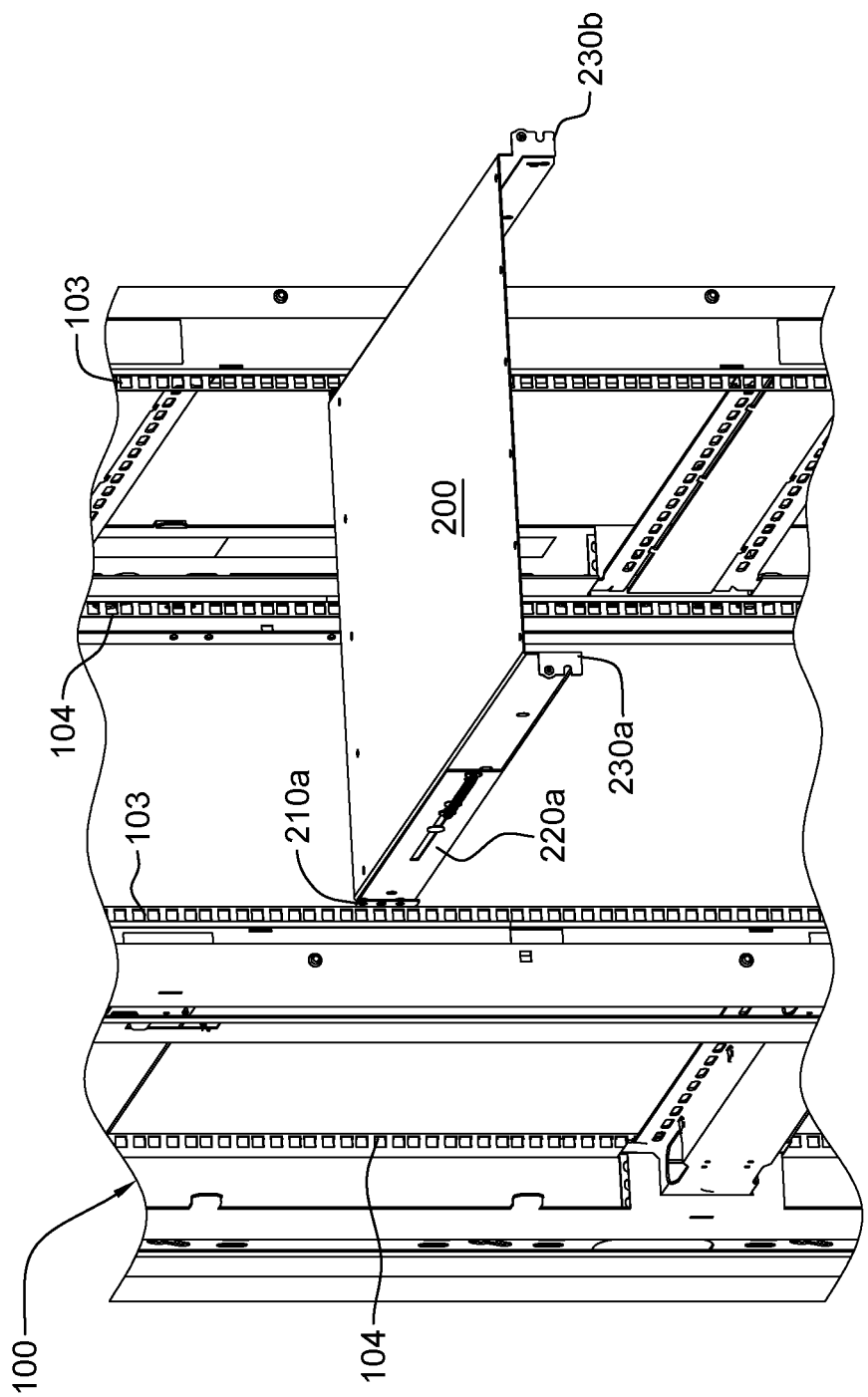
Figure 4D:
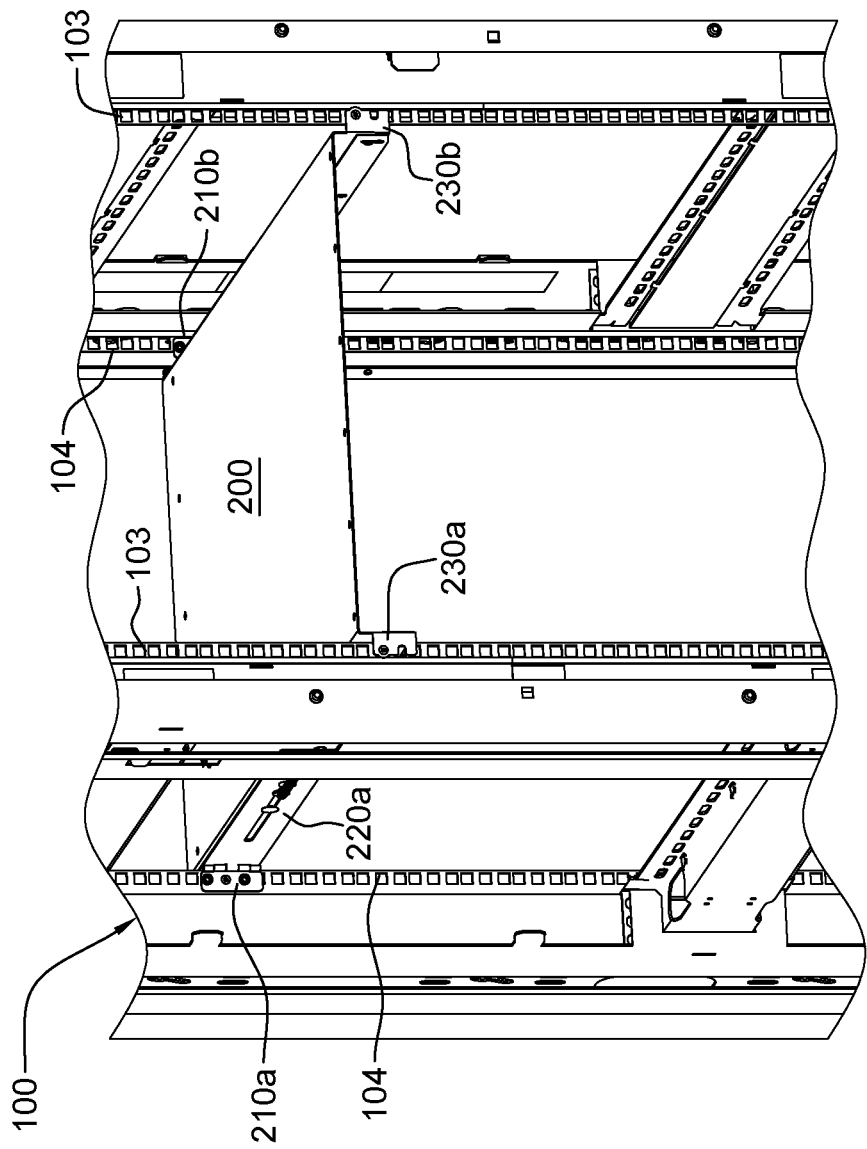

By way of further example, FIGS. 4A-4D depict operation of the spring-hinged mounting brackets as the rack-mountable assembly is slid into position within an unpopulated frame of an electronics rack 100. In the embodiment illustrated, first and second spring-hinged mounting brackets 210a, 210b are disposed at respective sides 201, 202 at one end of structure 200, with the other end including fixed-angle mounting brackets 230a, 230b which, in one or more embodiments, are rigid mounting brackets. In FIG. 4A, structure 200 is shown being moved into the frame of electronics rack 100 in a final, mounting orientation, that is, in an orientation corresponding to the orientation with which the structure is mounted into the frame. In this case, structure 200 is oriented substantially horizontal as it is moved into the frame of the electronics rack. In FIG. 4B, spring-hinged mounting brackets 210a, 210b, encounter front vertical mounting rails 103 of the frame at, for instance, the front of the frame. As the structure continues to be moved into the frame, the spring-hinged mounting brackets pivot inward towards the side of the structure as the spring-hinged mounting brackets are pushed against the respective vertical mounting rails, as shown in FIG. 4C. In FIG. 4D, the spring-hinged mounting brackets 210a, 210b have moved past the respective front vertical mounting rails 103 at the front edge of the frame, and pivoted open to an extended position to facilitate fixedly mounting the structure to the frame using appropriate fasteners. In particular, in one or more embodiments, the fixed-angle mounting brackets 230a, 230b are fastened to the front vertical rail flanges using appropriate fasteners, and the spring-hinged mounting brackets 210a, 210b are secured to the respective rear vertical mounting rails 104, thereby fixedly mounting the cover structure to the frame.

FIGS. 5A & 5B are side elevational views showing operation of the slidable members at the first and second side surfaces of the structure, and in particular, operation of the spring-biased, telescoping side mounting surfaces. By way of example, in FIG. 5A, spring-hinged mounting bracket 210a or rack-mountable assembly 110 has encountered the rear vertical mounting rail 104, pivoting inward, and in FIG. 5B, the spring-biased, telescoping side surface has moved the spring-hinged mounting bracket past the rear vertical mounting rail 104 to, for instance, facilitate mounting the spring-hinged mounting bracket from the back of the electronics rack to the rear vertical mounting rail flange. Advantageously, in one or more embodiments, slidable member 220a is spring-biased in an extended position (to the left in FIGS. 5A & 5B) to assist in mounting the structure to a range of different rack depths. In one implementation, the slidable member can be spring-biased to default to any desired default length, with the position of the spring-hinged mounting brackets being readily manipulated by an operator or service technician in order to align the brackets in the appropriate position against the respective vertical support rail flange to which the structure is to be affixed, either from the front side or the back side of the electronics rack.

Figure 6:
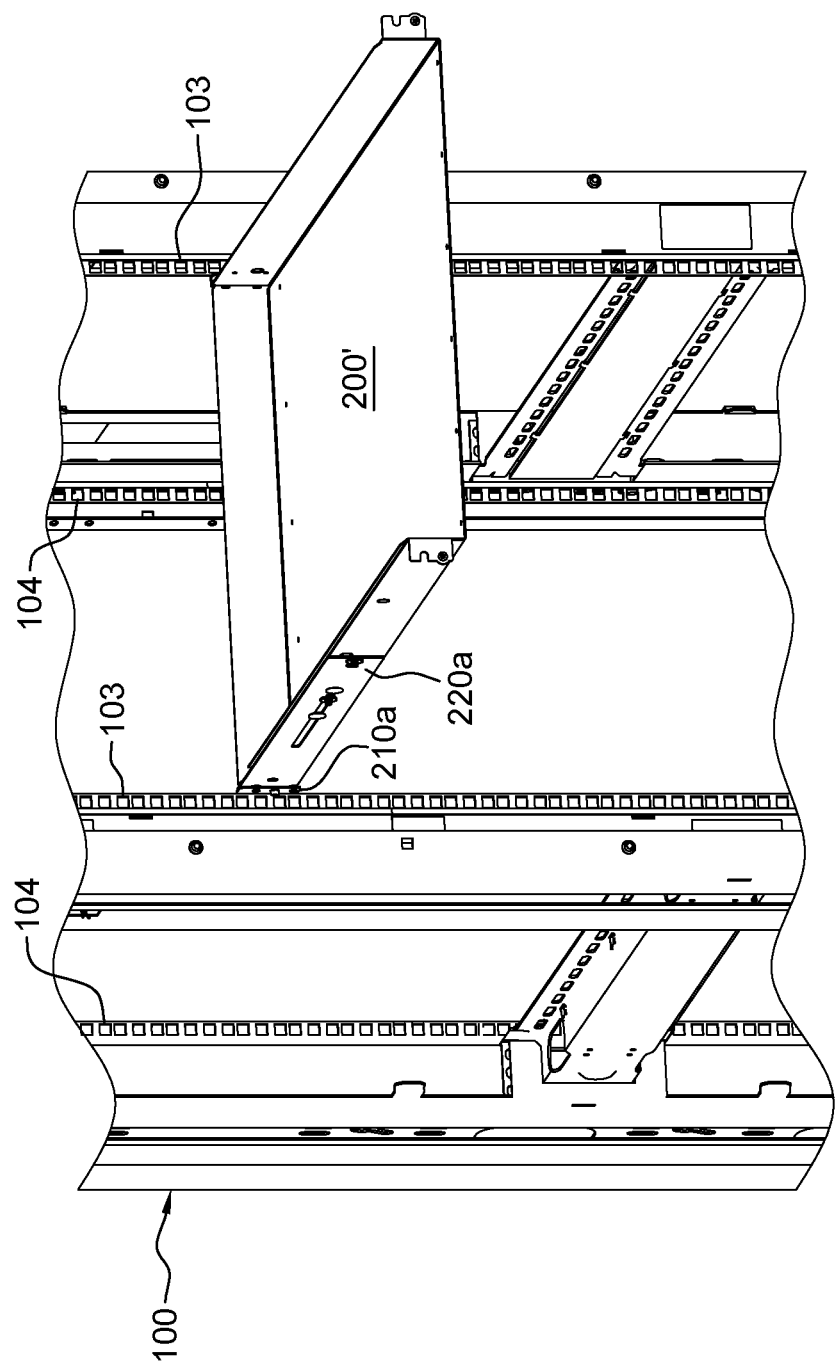
FIG. 6 depicts another embodiment of a rack-mountable assembly, in accordance with one or more aspects of the present invention.

The rack-mountable assembly disclosed above in connection with FIGS. 2A-5B can be differently configured, and still use the same or similar spring-hinged mounting brackets and spring-biased slidable members. For instance, FIG. 6 depicts a rack-mountable assembly, where the structure is a component support structure 200', such as a tray to be fixedly secured within the frame of and electronics rack, such as to front and rear vertical mounting rails 103, 104 of electronics rack 100. In one implementation, component support structure 200' can be similar to the structure 200 described above for use as a cover structure within the electronics rack, with the exception being that the structure is flipped upside down to in order to provide a surface with sidewalls within which to place and hold one or more electronic components (not shown) to be positioned within the electronics rack. In one embodiment, the configuration, positioning, and function of spring-hinged mounting brackets 210a, 210b and slidable members 220a, 220b can be substantially identical to that described above in connection with FIGS. 2A-5B.

Figure 7:
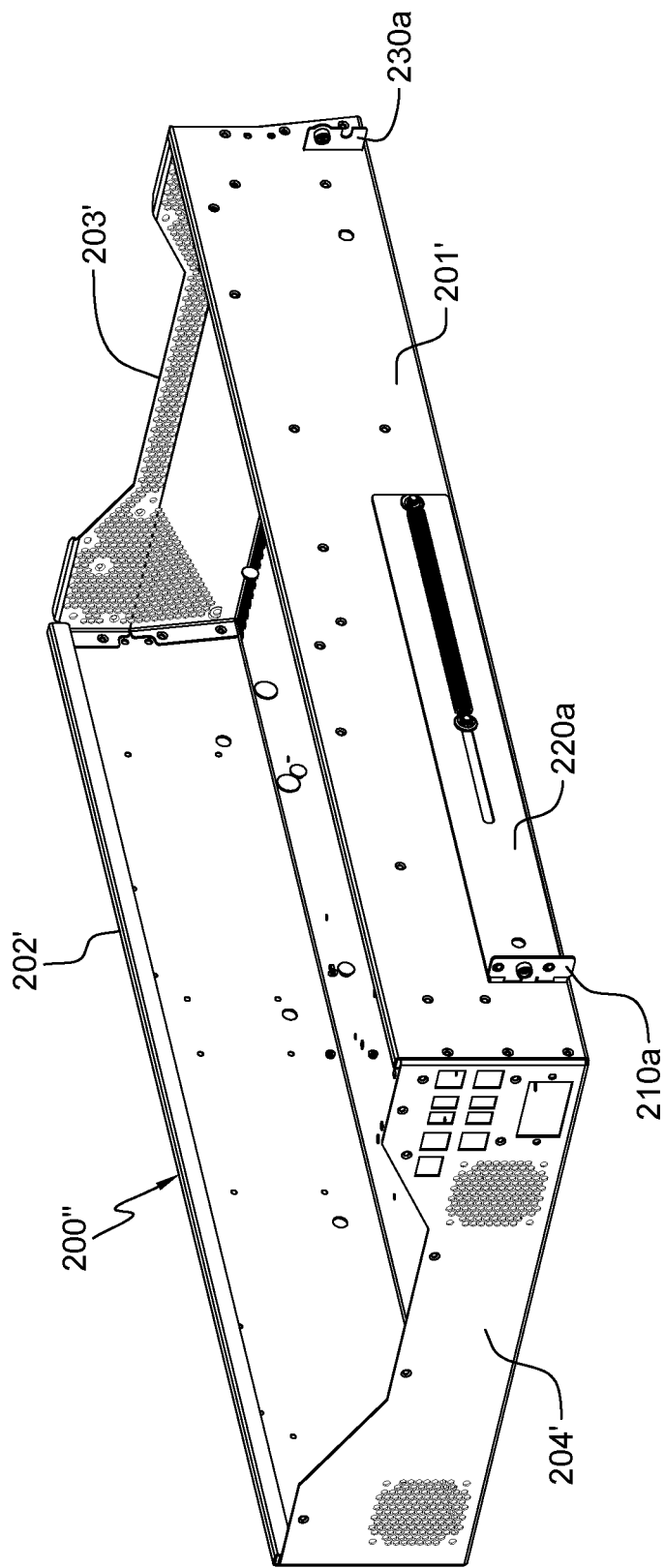
FIG. 7 depicts a further embodiment of a rack-mountable assembly, in accordance with one or more aspects of the present invention.

FIG. 7 depicts a further variation, where the side walls 201', 202' and end walls 203', 204' of the component support structure of FIG. 6 are extended to define an electronic component chassis 200" or drawer configured to be fixedly mounted within the frame of an electronics rack. Those skilled in the art will note that the component support structure could take any of a wide variety of configurations, with the rack-mountable assemblies disclosed herein facilitating fixedly securing the component support structures within the frame of the electronics rack from, for instance, a front side or a back side of the electronics rack, particularly in the case where the electronics rack is populated and an operator or service technician is servicing or replacing one or more components of the rack.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An apparatus comprising:
   a rack-mountable assembly for an electronics rack, the rack-mountable assembly comprising:
   a structure to be mounted to a frame of the electronics rack; and
   a spring-hinged mounting bracket associated with and extending from a side of the structure to facilitate mounting the structure to the frame, the spring-hinged mounting bracket facilitating insertion of the structure into the frame by pivoting inward towards the side of the structure upon the spring-hinged mounting bracket encountering an obstruction as the rack-mountable assembly is positioned within the frame for mounting to the frame.

2. The apparatus of claim 1, wherein the rack-mountable assembly comprises multiple spring-hinged mounting brackets to facilitate mounting the structure to the frame, the spring-hinged mounting bracket being one spring-hinged mounting bracket of the multiple spring-hinged mounting brackets, and wherein the structure comprises opposite first and second sides, a first spring-hinged mounting bracket of the multiple spring-hinged mounting brackets being mounted to and extending from the first side of the structure, and a second spring-hinged mounting bracket of the multiple spring-hinged mounting brackets being mounted to and extending from the second side of the structure.

3. The apparatus of claim 2, wherein the first side of the structure comprises a first slidable member, a leaf of the first spring-hinged mounting bracket being the first slidable member, and the second side of the structure comprises a second slidable member, a leaf of the second spring-hinged mounting bracket being the second slidable member.

4. The apparatus of claim 3, wherein the first and second slidable members are first and second spring-biased, telescoping side surfaces that facilitate the first and second spring-hinged mounting brackets contacting respective vertical rail flanges of the frame of the electronics rack for mounting thereto.

5. The apparatus of claim 4, wherein the first and second spring-hinged mounting brackets are closer to one end of the structure than another end, and wherein the structure includes first and second fixed-angle mounting brackets affixed to and extending from the structure closer to the other end of the structure, the one end and the other end being opposite ends of the structure.

6. The apparatus of claim 3, wherein the structure, the multiple spring-hinged mounting brackets, and the first and second slidable members are integrated as a single-piece assembly for mounting to any of multiple electronics racks, the multiple electronics racks having vertical rail flanges to which the multiple spring-hinged mounting brackets are to be mounted, the vertical rail flanges being located at different depths within different electronics racks of the multiple electronics racks.

7. The apparatus of claim 1, wherein the structure mounts horizontally within the frame of the electronics rack, the frame includes multiple vertical rails, with the obstruction being a vertical rail of the multiple vertical rails of the frame, and wherein the structure is selected from the group consisting of a cover structure and a component support structure.

8. The apparatus of claim 1, further comprising an electronic component drawer coupled to the frame of the electronics rack, and wherein the structure of the rack-mountable assembly is a cover structure comprising a cover for the electronic component drawer, the cover to fixedly mount to the frame of the electronics rack.

9. The apparatus of claim 1, wherein the structure is a component support structure comprising a tray to fixedly mount to the frame of the electronics rack.

10. The apparatus of claim 1, wherein the structure is a component support structure comprising an electronic component chassis to fixedly mount to the frame of the electronics rack.

11. An apparatus comprising:
an electronics rack comprising a frame;
a rack-mountable assembly comprising:
   a structure configured for the electronics rack; and
   a spring-hinged mounting bracket associated with and extending from a side of the structure to facilitate mounting the structure to the frame, the spring-hinged mounting bracket facilitating insertion of the structure into the frame by pivoting inward towards the side of the structure upon the spring-hinged mounting bracket encountering an obstruction as the rack-mountable assembly is positioned within the frame for mounting to the frame.

12. The apparatus of claim 11, wherein the rack-mountable assembly comprises multiple spring-hinged mounting brackets to facilitate mounting the structure to the frame, the spring-hinged mounting bracket being one spring-hinged mounting bracket of the multiple spring-hinged mounting brackets, and wherein the structure comprises opposite first and second sides, a first spring-hinged mounting bracket of the multiple spring-hinged mounting brackets being mounted to and extending from the first side of the structure, and a second spring-hinged mounting bracket of the multiple spring-hinged mounting brackets being mounted to and extending from the second side of the structure.

13. The apparatus of claim 12, wherein the first side of the structure comprises a first slidable member, a leaf of the first spring-hinged mounting bracket being the first slidable member, and the second side of the structure comprises a second slidable member, a leaf of the second spring-hinged mounting bracket being the second slidable member.

14. The apparatus of claim 13, wherein the first and second slidable members are first and second spring-biased, telescoping side surfaces that facilitate the first and second spring-hinged mounting brackets contacting respective vertical rail flanges of the frame of the electronics rack for mounting thereto.

15. The apparatus of claim 14, wherein the first and second spring-hinged mounting brackets are closer to one end of the structure than another end, and wherein the structure includes first and second fixed-angle mounting brackets affixed to and extending from the structure closer to the other end of the structure, the one end and the other end being opposite ends of the structure.

16. The apparatus of claim 13, wherein the structure, the multiple spring-hinged mounting brackets, and the first and second slidable members are integrated as a single-piece assembly for mounting to any of multiple electronics racks, the multiple electronics racks having vertical rail flanges to which the multiple spring-hinged mounting brackets are to be mounted, the vertical rail flanges being located at different depths within different electronics racks of the multiple electronics racks.

17. The apparatus of claim 11, further comprising an electronic component drawer coupled to the frame of the electronics rack, and wherein the structure of the rack-mountable assembly is a cover structure comprising a cover for the electronic component drawer, the cover being fixedly mounted to the frame of the electronics rack.

18. The apparatus of claim 11, wherein the structure is a component support structure comprising a tray fixedly mounted to the frame of the electronics rack.

19. The apparatus of claim 11, wherein the structure is a component support structure comprising an electronic component chassis fixedly mounted to the frame of the electronics rack.

20. A method comprising:
providing a rack-mountable assembly for an electronics rack, the providing comprising:
   providing a structure to be mounted to a frame of the electronics rack; and
   associating a spring-hinged mounting bracket with a side of the structure to extend from the side of the structure and facilitate mounting the structure to the frame, the spring-hinged mounting bracket facilitating insertion of the structure into the frame by pivoting inward towards the side of the structure upon the spring-hinged mounting bracket encountering an obstruction as the rack-mountable assembly is positioned within the frame for mounting to the frame.

\* \* \* \* \*